United States Patent
Nam et al.

(10) Patent No.: US 8,698,529 B2
(45) Date of Patent: Apr. 15, 2014

(54) DELAY TIME CONTROL CIRCUIT AND CONTROL METHOD THEREOF

(71) Applicant: Electronics and Telecommunications Research Institute, Daejeon (KR)

(72) Inventors: Jaewon Nam, Daejeon (KR); Minki Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/758,991

(22) Filed: Feb. 4, 2013

(65) Prior Publication Data
US 2014/0062554 A1    Mar. 6, 2014

(30) Foreign Application Priority Data
Sep. 6, 2012 (KE) .................. 10-2012-0098922

(51) Int. Cl.
H03L 7/06 (2006.01)
(52) U.S. Cl.
USPC ........................................... 327/158; 327/149
(58) Field of Classification Search
CPC ............................ H03L 7/0814; H03L 7/0812
See application file for complete search history.

(56) References Cited

U.S. PATENT DOCUMENTS

| | | | | |
|---|---|---|---|---|
| 5,610,954 | A * | 3/1997 | Miyashita et al. | 375/375 |
| 5,889,828 | A * | 3/1999 | Miyashita et al. | 375/374 |
| 2008/0132195 | A1* | 6/2008 | Maxim et al. | 455/334 |
| 2008/0165591 | A1* | 7/2008 | Kim et al. | 365/189.05 |
| 2010/0090723 | A1* | 4/2010 | Nedovic et al. | 327/3 |
| 2010/0165761 | A1* | 7/2010 | Kim et al. | 365/193 |
| 2010/0165762 | A1* | 7/2010 | Kim et al. | 365/193 |
| 2010/0188129 | A1* | 7/2010 | Ma | 327/294 |

FOREIGN PATENT DOCUMENTS

JP    2009-284466 A    12/2009

OTHER PUBLICATIONS

Kuo-Hsing Cheng et al., "A Wide-Range DLL-based Clock Generator with Phase Error Calibration", IEEE, 2008, pp. 798-801.
H.Y. Song et al., "Analysis and design of fast settling voltage-controlled delay line with dual-input interpolating delay cells", Electronics Letters, May 27, 2010, vol. 46, No. 11.

* cited by examiner

Primary Examiner — Adam Houston (57) ABSTRACT

A delay time control circuit is provided which includes a delay locked loop generating a second clock signal delayed by a predetermined time in response to a first clock signal; a plurality of delay circuits each receiving the first and second clock signals and outputting third and fourth clock signals in response to first and second digital clock signals; and a feedback control unit receiving the third and fourth clock signals to detect a delay time and generating the first and second digital control signals for compensating the detected delay time.

13 Claims, 5 Drawing Sheets

DELAY TIME CONTROL CIRCUIT AND CONTROL METHOD THEREOF

CROSS-REFERENCE TO RELATED APPLICATIONS

A claim for priority under 35 U.S.C. §119 is made to Korean Patent Application No. 10-2012-0098922 filed Sep. 6, 2012, in the Korean Intellectual Property Office, the entire contents of which are hereby incorporated by reference.

BACKGROUND

The inventive concepts described herein relate to a delay time control circuit, and more particularly, relate to a delay time control circuit capable of controlling a delay time using a plurality of current sources and a control method thereof.

A delay time control circuit may be used to control signals associated with a circuit operation where a semiconductor device or many circuits operates normally. In general, the delay time control circuit may use a manner in which a current amount of an inverter is varied or a manner in which an output load of an inverter is varied. A delay time between an input clock and an output clock of an inverter may be reversely proportional to a current amount applied to the inverter, and may be proportional to a size of an output load. This inverter manner may operate in a structure formed of PMOS and NMOS transistors.

In the delay time control circuit, however, a delay time of a critical path may be different according to a variation in an external voltage or a temperature due to a characteristic of a MOS transistor. For example, the delay time control circuit may be designed on the basis of a worst condition (e.g., a low-voltage and high-temperature state) of a storage element to obtain a fast access time. If the delay time control circuit thus designed operates at a best condition (e.g., a high-voltage and low-temperature state) under the condition that a delay time difference of a critical path is not compensated, a response speed of the delay time control circuit may become fast. Since an operating time between signals for controlling a circuit is not matched, an operation of a circuit may be delayed. Or, since a path delay difference is serious, an abnormal operation may arise.

On the other hand, if the delay time control circuit compensates a difference of a path delay time in view of a best condition of a storage element, an operation of a circuit may be delayed at a worst condition or it is difficult to realize a fast access time. In the delay time control circuit adopting the inverter manner it is difficult to precisely match operating times of circuits according to an external property.

Thus, development on a delay time control circuit may be made to precisely match precisely match operating times of circuits according to an external property.

SUMMARY

One aspect of embodiments of the inventive concept is directed to provide a delay time control circuit which comprises a delay locked loop generating a second clock signal delayed by a predetermined time in response to a first clock signal; a plurality of delay circuits each receiving the first and second clock signals and outputting third and fourth clock signals in response to first and second digital clock signals; and a feedback control unit receiving the third and fourth clock signals to detect a delay time and generating the first and second digital control signals for compensating the detected delay time.

Another aspect of embodiments of the inventive concept is directed to provide a method controlling a time of a clock signal. The method comprises generating a second clock signal delayed by a predetermined time in response to a first clock signal; receiving the first and second clock signals and outputting third and fourth clock signals in response to first and second digital clock signals; and detecting a delay time based on the third and fourth clock signals and generating the first and second digital control signals for compensating the detected delay time.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 1:
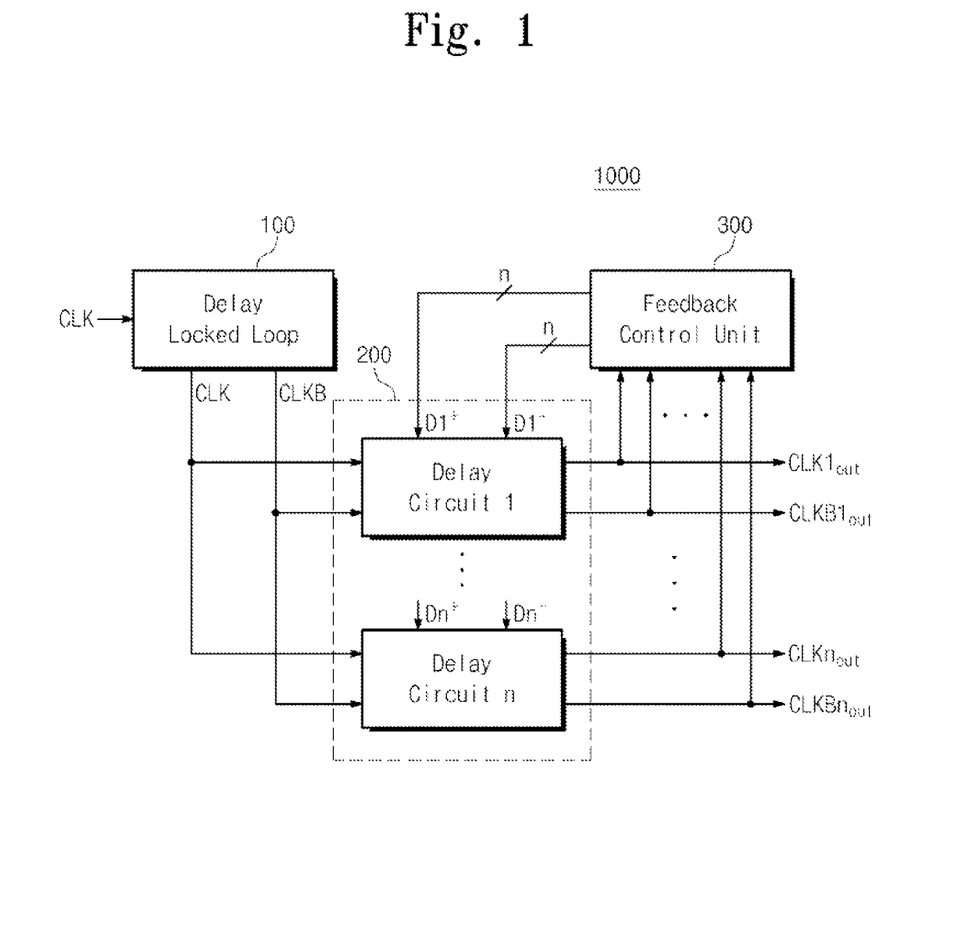
FIG. 1 is a block diagram schematically illustrating a delay time control circuit according to an embodiment of the inventive concept.

FIG. 1 is a block diagram schematically illustrating a delay time control circuit according to an embodiment of the inventive concept. Referring to FIG. 1, a delay time control circuit 1000 may include a delay locked loop 100, a delay circuit unit 200, and a feedback control unit 300.

The delay locked loop 100 may receive a first clock signal CLK from an external device. The delay locked loop 100 may generate a second clock signal CLKB delayed by a time Tunit in response to the first clock signal CLK. The delay locked loop 100 may generate the second clock signal CLKB to be inverted with respect to the first clock signal CLK. The delay locked loop 100 may apply the first clock signal CLK and the second clock signal CLKB to a plurality of delay circuits.

The delay circuit unit 200 may include a plurality of delay circuits being configured the same. Each delay circuit according to an embodiment of the inventive concept may be configured to have a Gilbert cell structure. Each delay circuit may receive the first clock signal CLK and the second clock signal CLKB from the delay locked loop 100. Each delay circuit may control delay times of output signals in response to first and second digital control signals Dn+ and Dn− from the feedback control unit 300. Also, the feedback control unit 300 may generate the first and second digital control signals Dn+ and Dn− based on first and second clock signals $CLK1_{OUT}$ to $CLKn_{OUT}$ and $CLKB1_{OUT}$ to $CLKBn_{OUT}$ output from the delay circuits. This will be more fully described with reference to FIG. 3.

The feedback control unit 300 may receive the first and second clock signals $CLK1_{OUT}$ to $CLKn_{OUT}$ and $CLKB1_{OUT}$ to $CLKBn_{OUT}$ output from the delay circuits. The feedback control unit 300 may generate the first and second digital control signals Dn+ and Dn− based on the first and second clock signals $CLK1_{OUT}$ to $CLKn_{OUT}$ and $CLKB1_{OUT}$ to $CLKBn_{OUT}$ output from the delay circuits. The first and second digital control signals Dn+ and Dn− may be applied to each delay circuit. In other words, the feedback control unit 300 may receive the first and second clock signals $CLK1_{OUT}$ to $CLKn_{OUT}$ and $CLKB1_{OUT}$ to $CLKBn_{OUT}$ output from the delay circuits to check a delayed time, that is, a delayed phase. The feedback control unit 300 may generate the first and second digital control signals Dn+ and Dn− to offset a delay time. If a phase difference does not arise at the first and second clock signals $CLKn_{OUT}$ and $CLKBn_{OUT}$ received from each delay circuit, the feedback control unit 300 may finally output the first and second clock signals $CLKn_{OUT}$ and $CLKBn_{OUT}$.

As described above, the delay locked loop 100 may generate the second clock signal CLKB delayed by Tunit in response to the first clock signal applied from an external device. The delay locked loop 100 may generate the second clock signal CLKB to have a phase opposite to that of the first clock signal CLK. The first and second clock signals CLK and CLKB may be applied to each delay circuit. Each delay circuit may output the first and second clock signals $CLKn_{OUT}$ and $CLKBn_{OUT}$ to the feedback control unit 300 in response to the first and second clock signals CLK and CLKB. The feedback control unit 300 may check a delayed phase error of the first and second clock signals $CLKn_{OUT}$ and $CLKBn_{OUT}$. If a phase error exists, the feedback control unit 300 may generate the first and second digital control signals Dn+ and Dn− to offset a phase error. On the other hand, if a phase error does not exist, the feedback control unit 300 may finally output the first and second clock signals $CLKn_{OUT}$ and $CLKBn_{OUT}$. Thus, the feedback control unit 300 may control the above-described iteration procedure to generate a plurality of clock signals in which a phase error (i.e., a delay time) does not exist.

Figure 2:
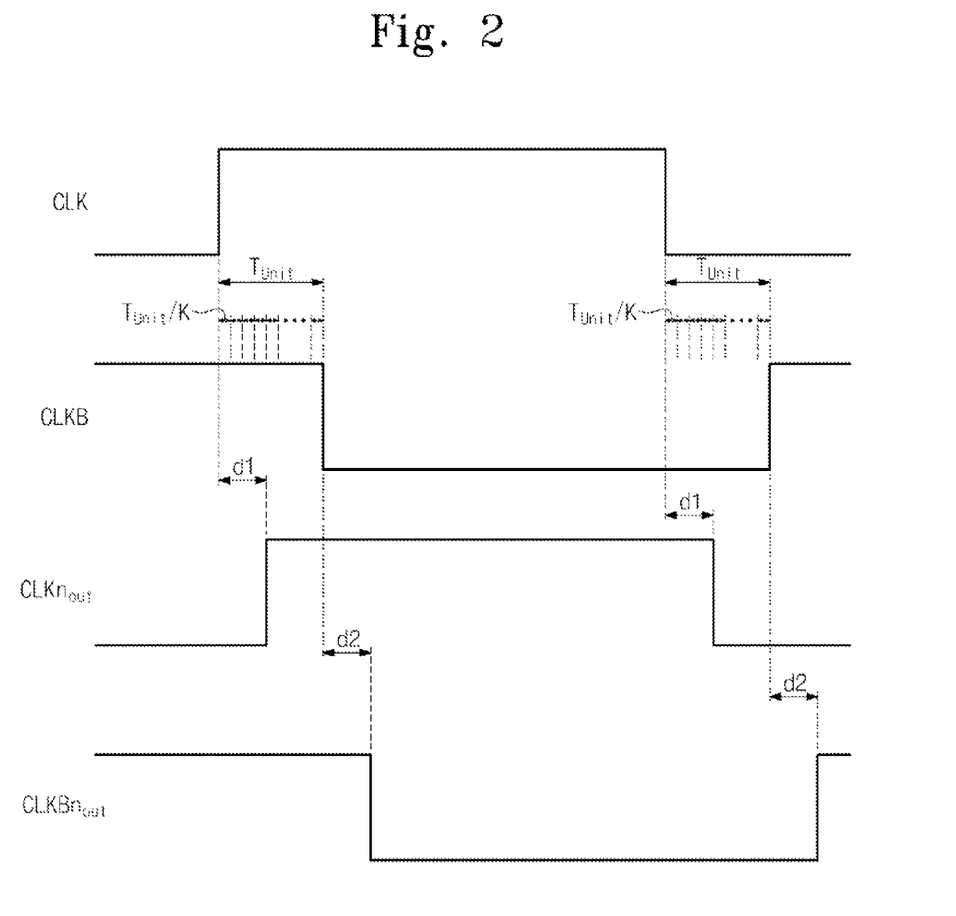
FIG. 2 is a waveform diagram illustrating first and second clock signals output from a delay locked loop and delay circuits in FIG. 1.

FIG. 2 is a waveform diagram illustrating first and second clock signals output from a delay locked loop and delay circuits in FIG. 1.

Referring to FIG. 2, a delay locked loop 100 (refer to FIG. 1) may generate a second clock signal CLKB delayed by Tunit in response to a first clock signal CLK. Herein, a phase corresponding to the delay time Tunit may be divided by K. A phase of the second clock signal CLKB may be inverted compared with a phase of the first clock signal CLK. Also, each delay circuit (refer to FIG. 1) may receive the first and second clock signals CLK and CLKB from the delay locked loop 100 to output first and second clock signals $CLKn_{OUT}$ and $CLKBn_{OUT}$. However, each delay circuit may output first and second clock signals $CLKn_{OUT}$ and $CLKBn_{OUT}$ delayed by a constant time in comparison with the first and second clock signals CLK and CLKB. In other words, each delay circuit may output the first clock signal $CLKn_{OUT}$ delayed by d1 in comparison with the first clock signal CLK, and may output the second clock signal $CLKBn_{OUT}$ delayed by d2 in comparison with the second clock signal CLK. Clock signals output from each delay circuit may be applied to a he feedback control unit 300, and the feedback control unit 300 may check a phase error.

A phase delayed by Tunit may be used to control delay times of first clock signals and second clock signals CLK1$_{OUT}$ to CLKn$_{OUT}$ and CLKB1$_{OUT}$ to CLKBn$_{OUT}$ output from the respective delay circuits. Herein, a delay time may mean that a phase is delayed by an internal or external cause of a circuit. When the feedback control unit 300 controls a delayed phase error in response to output signals received from each delay circuit, it may generate first and second digital control signals Dn+ and Dn− based on a K-divided location.

Figure 3:
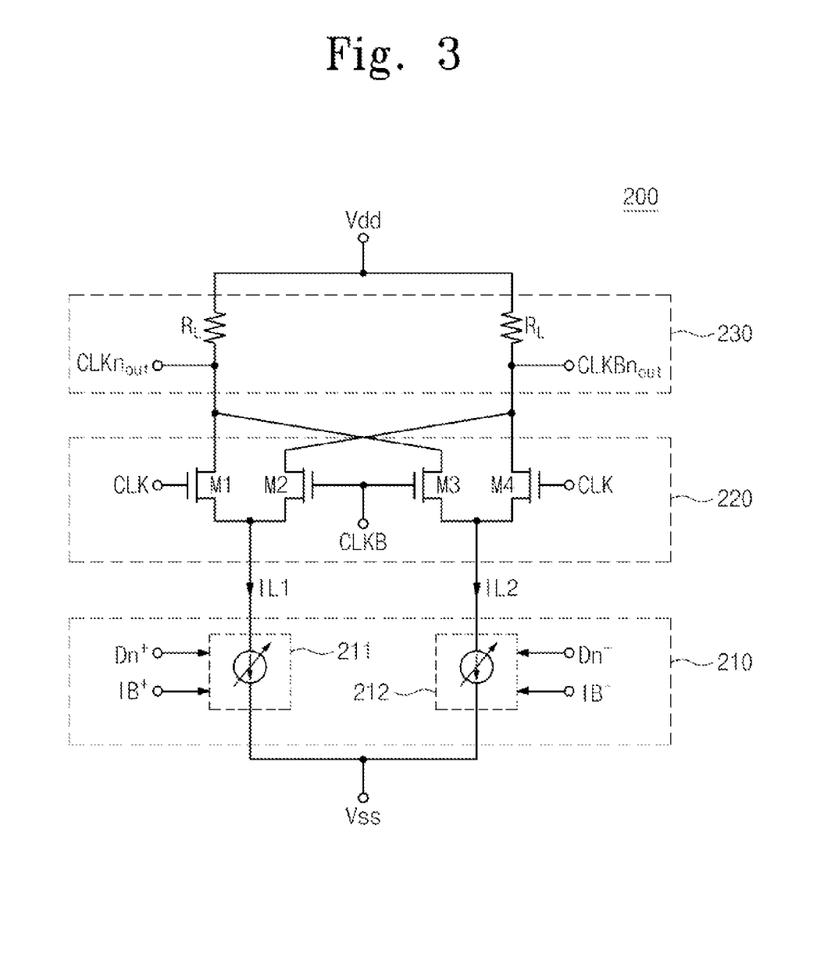
FIG. 3 is a circuit diagram schematically illustrating a delay circuit using a Gilbert cell structure.

FIG. 3 is a circuit diagram schematically illustrating a delay circuit using a Gilbert cell structure. Delay circuits in a delay circuit unit 200 may be configured the same. Referring to FIG. 3, a delay circuit may include a driving part 210, a switching part 220, and an output part 230.

The driving part 210 may include a first current part 211 and a second current part 212. Each of the first and second current parts 211 and 212 may be formed of n current sources. Each current source may be formed of an NMOS transistor being a switching element. The first current part 211 may receive a first digital control signal Dn+ and a first reference current signal IB+. The second current part 212 may receive a second digital control signal Dn− and a second reference current signal IB−. Phases of the first and second reference currents IB+ and IB− applied to the first and second current parts 211 and 212 may be opposite to each other. The first and second current parts 211 and 212 may control a current amount in response to the first and second digital control signals Dn+ and Dn− applied from a feedback control unit 300.

For this, the feedback control unit 300 may check delay times by comparing phases of first and second clock signals CLK1$_{OUT}$ to CLKn$_{OUT}$ and CLKB1$_{OUT}$ to CLKBn$_{OUT}$ output from the delay circuits. The feedback control unit 300 may check a phase value for controlling a delay time based on a K-divided phase Tunit (refer to FIG. 2). Herein, a phase value may indicate a point corresponding to one of a plurality of phases obtained by dividing Tunit by K. The feedback control unit 300 may generate the first and second digital control signals Dn+ and Dn− based on the checked phase value. The feedback control unit 300 may apply the first and second digital control signals Dn+ and Dn− to each delay circuit. The first and second current parts 211 and 212 in each delay circuit may control a current amount in response to the first and second digital control signals Dn+ and Dn−. Thus, it is possible to control a delay time more precisely.

The switching unit 220 may include a pair of transistors M1 and M2 for switching an output current of the first current part 211 and a pair of transistors M3 and M4 for switching an output current of the second current part 212. The first clock signal CLK may be applied to gates of the transistors M1 and M4, and the second clock signal CLKB phase delayed by Tunit may be applied to gates of the transistors M2 and M3. Herein, phases of the first and second clock signals CLK and CLKB may be opposite to each other. Each of the transistors M1 to M4 may be formed of an NMOS transistor. A drain of the transistor M2 may be electrically connected with a drain of the transistor M4, and a drain of the transistor M1 may be electrically connected with a drain of the transistor M3. A source of the transistor M1 may be electrically connected with a source of the transistor M2, and a source of the transistor M3 may be electrically connected with a source of the transistor M4.

The switching unit 220 may output the first clock signal CLKn$_{OUT}$ by performing a differential operation with respect to a first current IL1 and the first and second clock signals CLK and CLKB. An amount of the first current IL1 may be controlled in response to the first current unit 211. The switching unit 220 may output the second clock signal CLKBn$_{OUT}$ by performing a differential operation with respect to a second current IL2 and the first and second clock signals CLK and CLKB. An amount of the second current IL2 may be controlled in response to the second current part 212.

The output unit 230 may provide the feedback control unit 300 with the first and second clock signals CLKn$_{OUT}$ and CLKBn$_{OUT}$ output from the switching unit 220. The feedback control unit 300 may check a delayed time in response to the first and second clock signals CLKn$_{OUT}$ and CLKBn$_{OUT}$. The feedback control unit 300 may generate first and second digital control signals Dn+ and Dn− based on the delayed time, and may apply the first and second digital control signals Dn+ and Dn− to the first and second current parts 211 and 212. By iterating the above-described operation, the feedback control unit 300 may output the first and second clock signals CLKn$_{OUT}$ and CLKBn$_{OUT}$ without a delay time.

With the Gilbert cell structure, a differential signal of the first and second clock signals CLKn$_{OUT}$ and CLKBn$_{OUT}$ output from each delay circuit may be Tunit/2. However, the Gilbert cell structure of the inventive concept may control a differential signal more precisely by controlling the first and second current parts 211 and 212 according to the first and second digital control signals Dn+ and Dn−. A semiconductor device and systems in other fields may improve the performance using the first and second clock signals CLKn$_{OUT}$ and CLKBn$_{OUT}$ having no delay time by controlling a differential signal more precisely.

Figure 4:
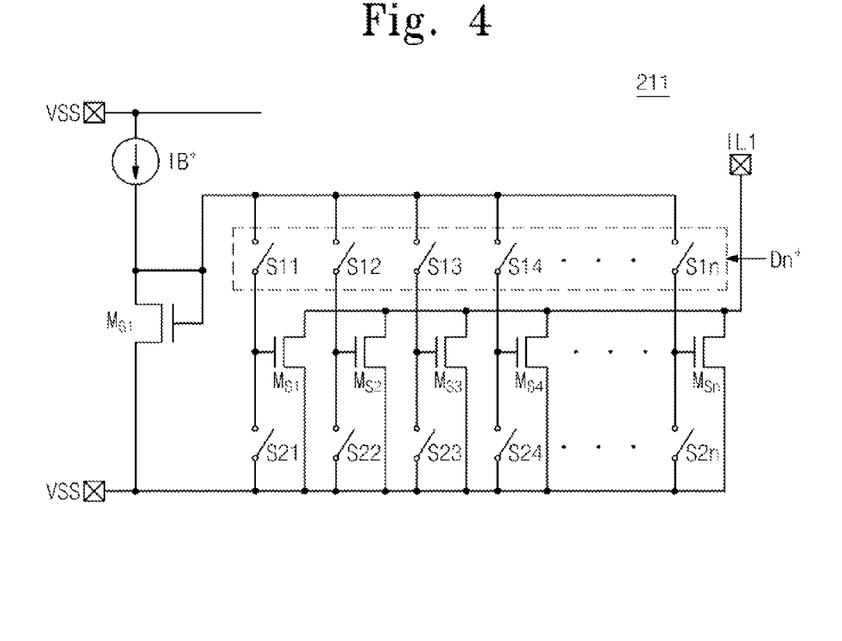
FIG. 4 is a circuit diagram illustrating a first current part of a driving unit in FIG. 3.
Figure 5:
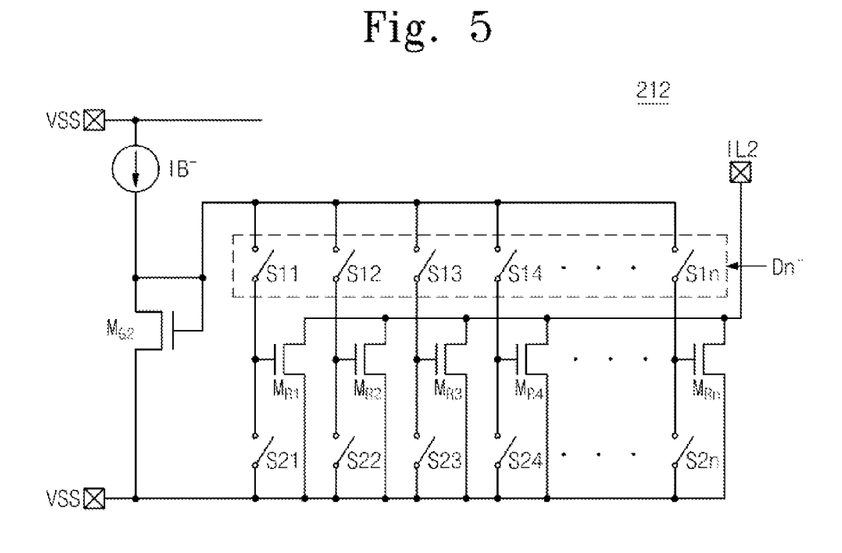
FIG. 5 is a circuit diagram illustrating a second current part of a driving unit in FIG. 3.

FIG. 4 is a circuit diagram illustrating a first current part of a driving unit in FIG. 3. FIG. 5 is a circuit diagram illustrating a second current part of a driving unit in FIG. 3.

Referring to FIG. 4, a first current part 211 in each delay circuit may be configured to have a current mirror structure, and may include a transistor $M_{G1}$, a plurality of first switching elements S11 to S1n, a plurality of second switching elements S21 to S2n, and a plurality of transistors $M_{S1}$ to $M_{Sn}$. Herein, the transistors $M_{G1}$ and $M_{S1}$ to $M_{Sn}$ may be NMOS transistors. A feedback control unit 300 (refer to FIG. 1) may apply a first digital control signal Dn+ to a first current part 211 to control the first and second switching elements S11 to S1n and S21 to S2n. The feedback control unit 300 may control the first and second switching elements S11 to S1n and S21 to S2n to operate complementarily. For example, when the switching element S11 is turned on by the first digital control signal Dn+, the switching element S21 may be turned off. The first current part 211 may receive a first reference current IB+, and may decide an amount of a first current IL1 in response to the first digital control signal Dn+. In more detail, the first switching elements S11 to S1n may be turned on in response to the first digital control signal Dn+. With the current mirror structure, the amount of the first current IL1 may be finally decided when the transistors $M_{S1}$ to $M_{Sn}$ operate in response to the first switching elements S11 to S1n being turned on. In other words, the amount of the first current IL1 may be calculated by multiplying the number of transistors $M_{S1}$ to $M_{Sn}$ turned on and the first reference voltage IB+ together.

$$IL1=(a)\times(IB+)\times TN \qquad (1)$$

Herein, "a" may be a constant according to a ratio of a size, and "TN" may indicate the number of transistors turned on.

Referring to FIG. 5, a second current part 212 in each delay circuit may be configured to have a current mirror structure, and may include a transistor $M_{G2}$, a plurality of first switching elements S11 to S1n, a plurality of second switching elements S21 to S2n, and a plurality of transistors $M_{R1}$ to $M_{Rn}$. Herein, the transistors $M_{G2}$ and $M_{R1}$ to $M_{Rn}$ may be NMOS transistors. The feedback control unit 300 may apply a second digital control signal Dn− to a second current part 212 to control the first and second switching elements S11 to S1n and S21 to S2n. The feedback control unit 300 may control the first and second switching elements S11 to S1n and S21 to S2n to operate complementarily. For example, when the switching element S11 is turned on by the second digital control signal Dn−, the switching element S21 may be turned off. The second current part 212 may receive a second reference current IB−, and may decide an amount of a second current IL2 in response to the second digital control signal Dn−. In more detail, the first switching elements S11 to S1n may be turned on in response to the second digital control signal Dn−. With the current mirror structure, the amount of the second current IL2 may be finally decided when the transistors $M_{R1}$ to $M_{Rn}$ operate in response to the first switching elements S11 to S1n being turned on. In other words, the amount of the second current IL2 may be calculated by multiplying the number of transistors $M_{R1}$ to $M_{Rn}$ turned on and the second reference voltage IB− together.

$$IL2=(a) \times (IB-) \times TN \quad (1)$$

Herein, "a" may be a constant according to a ratio of a transistor size, and "TN may indicate the number of transistors turned on.

The feedback control unit 300 may control the first and second digital control signals Dn+ and Dn− such that a sum of the first and second currents IL1 and IL2 from the first and second current parts 211 and 212 is always the same. In other words, the feedback control unit 300 control the first and second digital control signals Dn+ and Dn− such that a sum of the first and second currents IL1 and IL2 is always the same although an amount of a current from the first current part 211 is different from an amount of a current from the second current part 212. As an example, a first delay circuit (refer to FIG. 1) may receive first and second clock signals CLK and CLKB to apply first and second clock signals $CLK1_{OUT}$ and $CLKB1_{OUT}$ to the feedback control unit 300. The feedback control unit 300 may check a delayed time of the input clock signals. Referring to FIG. 2, the first clock signal $CLK1_{OUT}$ may be delayed by d1 in comparison with the first clock signal CLK, and the second clock signal $CLK2_{OUT}$ may be delayed by d2 in comparison with the second clock signal CLKB. The feedback control unit 300 may check a phase value for controlling a delayed time according to a phase of Tunit K-divided. The feedback control unit 300 may generate first and second n-bit digital signals D1+ and D1− to be applied to the first delay circuit according to an appointed phase value. The first and second current parts 211 and 212 may control a phase error of d1 and d2 in response to the first and second digital control signals D1+ and D1−. The first and second digital control signals D1+ and D1− may be complementary.

For example, it is assumed that a 10-bit digital signal is generated. If a logic value of the first digital control signal D1+ to be applied to the first current part 211 is "1110000000", a logic value of the second digital control signal D1− to be applied to the second current part 212 is "0001111111". At this time, the first current part 211 may operate three transistors according to a 3-bit high signal, and the second current part 212 may operate seven transistors according to a 7-bit high signal. In other words, the feedback control unit 300 may control a logic value to be applied to the first current part 211 and a logic value to be applied to the second current part 212 to be complementary. As described above, the first current part 211 may output a current value of "3×IB" based on a first reference current IB+(refer to FIG. 3), and the second current part 212 may output a current value of "7×IB" based on a second reference current IB− (refer to FIG. 3).

With the above description, the feedback control unit 300 may control a delay time more precisely by differently controlling current values applied to the first and second current parts 211 and 212 in each delay circuit. However, under the control of the feedback control unit 300, a sum of currents from the first and second current parts 211 and 212 may be controlled to be always constant. Logic values of the first and second 10-bit digital control signals D1+ and D1− generated through the feedback control unit 300 may not be limited to this disclosure. For example, Logic values of the first and second 10-bit digital control signals D1+ and D1− may vary according to a delayed phase error of the first and second clock signals $CLKn_{OUT}$ and $CLKBn_{OUT}$. Likewise, the feedback control unit 300 may generate first and second digital control signals Dn+ and Dn− corresponding to a phase value of Tunit K-divided in response to first and second clock signals $CLK1_{OUT}$ to $CLKn_{OUT}$ and $CLKB1_{OUT}$ to $CLKBn_{OUT}$ output from the delay circuits. Since the delay circuits are configured the same, an internally generated delay time of each delay circuit may be ignored.

The first and second current parts 211 and 212 may receive the first and second digital control signals Dn+ and Dn− from the feedback control unit 300.

The first and second current parts 211 and 212 may control a current amount in response to the first and second digital control signals Dn+ and Dn−, so that delay times of the first and second clock signals $CLKn_{OUT}$ and $CLKBn_{OUT}$ are controlled more precisely.

Figure 6:
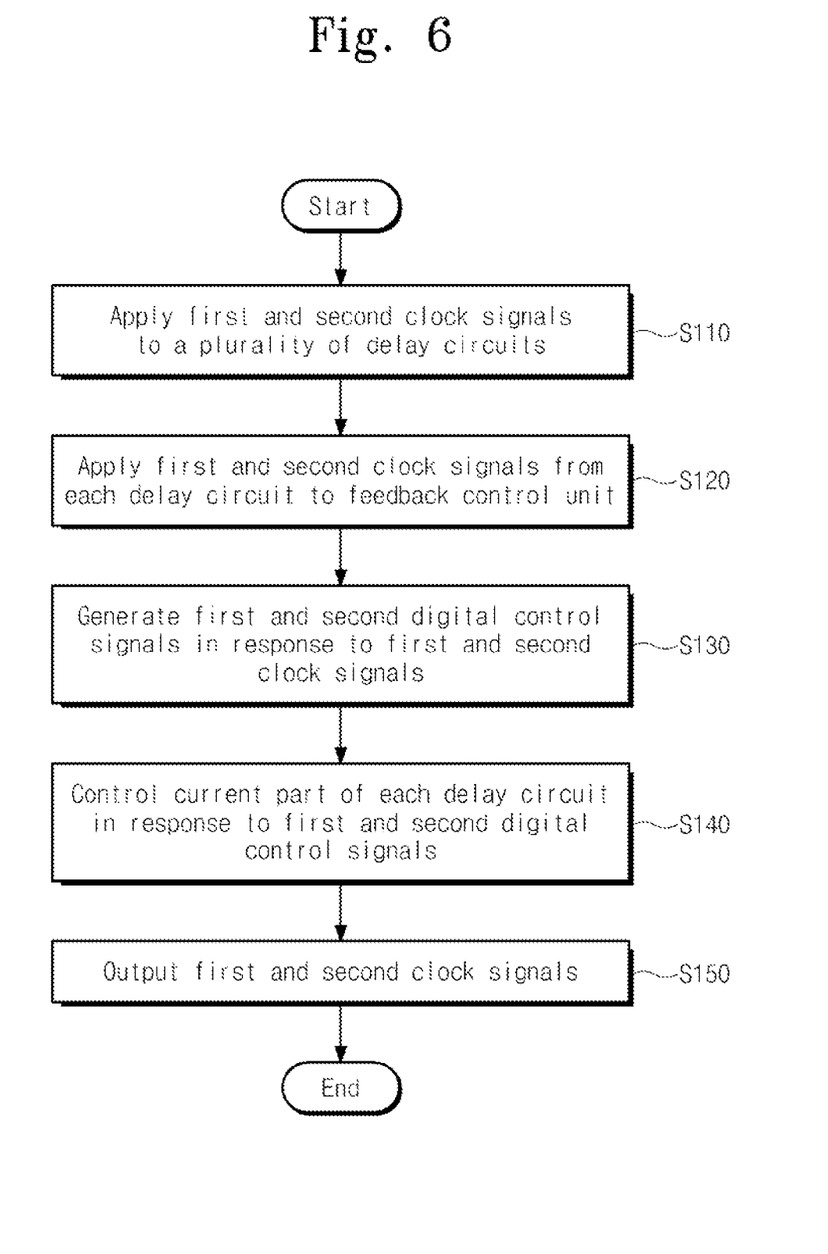
FIG. 6 is a flow chart illustrating an operation of a delay time control circuit.

FIG. 6 is a flow chart illustrating an operation of a delay time control circuit.

In operation S110, a delay locked loop 100 may receive a first clock signal CLK from an external device. The delay locked loop 100 may respond to the first clock signal CLK to generate a second clock signal CLKB delayed by Tunit and having a phase opposite to a phase of the first clock signal CLK. The delay locked loop 100 may apply the first and second clock signals CLK and CLKB to a plurality of delay circuit.

In operation S120, each delay circuit may receive the first and second clock signals CLK and CLKB from the delay locked loop 100. The delay circuits may be configured the same. In particular, each delay circuit may use a Gilbert cell structure, and may include first and second current parts 211 and 212 (refer to FIG. 3) for controlling a current amount. With the Gilbert cell structure, a differential signal of a first clock signal $CLKn_{OUT}$ and a second clock signal $CLKBn_{OUT}$ output from each delay circuit may become Tunit/2. However, the Gilbert cell structure may control a range of the differential signal more precisely using a manner in which current amounts of the first and second current parts 211 and 212 are controlled. A feedback control unit 300 may be used to control a range of the differential signal more precisely. Each delay circuit may apply the first clock signal $CLKn_{OUT}$ and the second clock signal $CLKBn_{OUT}$ to the feedback control unit 300.

In operation S130, the feedback control unit 130 may receive the first clock signal $CLKn_{OUT}$ and the second clock signal $CLKBn_{OUT}$ from each delay circuit. The feedback control unit 300 may check a delayed phase value with respect to received output signals. The feedback control unit 300 may generate first and second digital control signals Dn+ and Dn− for controlling a delayed phase error. In more detail, the feedback control unit 300 may check a point at which the delayed phase error is offset based on a range of Tunit K-divided, in response to received clock signals. The feedback control unit 300 may generate first and second digital control signals Dn+ and Dn− corresponding to a point at which a delayed phase error is canceled. The feedback control unit 300 may provide each delay circuit with the first and second digital control signals Dn+ and Dn− for canceling the delayed phase value. Each delay circuit may finally output the first clock signal $CLKn_{OUT}$ and the second clock signal $CLKBn_{OUT}$ without a delay time through iteration of the above-described operation.

In operation S140, the first and second current parts 211 and 212 of each delay circuit may receive the first and second digital control signals Dn+ and Dn− from the feedback control unit 300. Each of the first and second current parts 211 and 212 may control a current amount in response to the first and second digital control signals Dn+ and Dn−. In more detail, the first and second current parts 211 and 212 of each delay circuit (refer to FIGS. 4 and 5) may include a plurality of transistors and first and second switching elements, and may turn on first switching elements in response to the first and second digital control signals Dn+ and Dn−. Each of the first and second current parts 211 and 212 may operate transistors according to first switching elements turned on. The feedback control unit 300 may control a current value output from the first current part 211 and a current value output from the second current part 212 to be different. A sum of currents output from the first and second current parts 211 and 212 may be controlled to be identical.

In operation S150, each delay circuit may receive the first and second digital control signals Dn+ and Dn− for canceling a delayed phase from the feedback control unit 300. Each delay circuit may finally output the first clock signal $CLKn_{OUT}$ and the second clock signal $CLKBn_{OUT}$ without a delay time. A semiconductor device or a system may be provided with a multi-channel of the first clock signal $CLKn_{OUT}$ and the second clock signal $CLKBn_{OUT}$ without a delay time.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A delay time control circuit, comprising:
   a delay locked loop generating a second clock signal delayed by a predetermined time in response to a first clock signal;
   a plurality of delay circuits each receiving the first and second clock signals and outputting third and fourth clock signals in response to first and second digital clock signals; and
   a feedback control unit receiving the third and fourth clock signals to detect a delay time and generating the first and second digital control signals for compensating the detected delay time.

2. The delay time control circuit of claim 1, wherein a phase of the second clock signal is opposite to a phase of the first clock signal.

3. The delay time control circuit of claim 1, wherein the first and second digital signals are complementary.

4. The delay time control circuit of claim 1, wherein each of the plurality of delay circuits includes first and second current parts; and
   wherein the first current part is formed of first switching elements and first transistors and operates in response to the first digital control signal and the second current part is formed of second switching elements and second transistors and operates in response to the second digital control signal.

5. The delay time control circuit of claim 4, wherein a current amount output from the first current part in each delay circuit is proportional to the number of turned-on transistors of the first transistors and a current amount output from the second current part in each delay circuit is proportional to the number of turned-on transistors of the second transistors.

6. The delay time control circuit of claim 5, wherein a sum of an output value of the first current part and an output value of the second current part is maintained to be identical.

7. The delay time control circuit of claim 1, wherein when the second clock signal is generated, the predetermined time delayed is divided by K.

8. The delay time control circuit of claim 7, wherein the feedback control unit generates the first and second digital control signals based on the predetermined time K-divided in the same interval.

9. The delay time control circuit of claim 8, wherein when a delay time detected from each delay circuit is not compensated the feedback control unit again generates the first and second digital control signals and applies the first and second digital control signals to the plurality of delay circuits.

10. A method controlling a time of a clock signal, comprising:
    generating a second clock signal delayed by a predetermined time in response to a first clock signal;
    receiving the first and second clock signals and outputting third and fourth clock signals in response to first and second digital clock signals; and
    detecting a delay time based on the third and fourth clock signals and generating the first and second digital control signals for compensating the detected delay time.

11. The method of claim 10, wherein a phase of the second clock signal is opposite to a phase of the first clock signal.

12. The method of claim 10, wherein compensating the detected delay time by controlling a first current value determined in response to the first digital clock signal and by controlling a second current value determined in response to the second digital clock signal.

13. The method of claim 12, wherein a sum of the first current value and the second current value is maintained to be identical.

* * * * *